United States Patent [19]
Knapp et al.

[11] Patent Number: 5,900,669
[45] Date of Patent: May 4, 1999

[54] SEMICONDUCTOR COMPONENT

[75] Inventors: James H. Knapp, Chandler; Keith E. Nelson, Tempe; Les Ticey, Gilbert; Kevin J. Foley, Phoenix, all of Ariz.

[73] Assignee: Motorola, Inc., Schaumburg, Ill.

[21] Appl. No.: 08/886,100

[22] Filed: Jun. 30, 1997

[51] Int. Cl.$^6$ ...................................................... H01L 23/28
[52] U.S. Cl. .............................. 257/701; 257/787; 29/840
[58] Field of Search ..................................... 257/700, 779, 257/723, 787, 701; 29/840; 264/272.15

[56] References Cited

U.S. PATENT DOCUMENTS 5,578,261  11/1996  Manzione et al. ................. 264/272.15
5,581,122  12/1996  Chao et al. .............................. 257/700
5,640,047   6/1997  Nakashima .............................. 257/700

*Primary Examiner*—Peter Toby Brown
*Assistant Examiner*—Roy Potter
*Attorney, Agent, or Firm*—Rennie William Dover

[57] ABSTRACT

A substrate having a vent (20) and a method of forming the vent (20). A substrate (11) has conductive traces (14) and a semiconductor chip attach pad (17) on a top surface and conductive traces (12) and a bonding pad (13) on the bottom surface. A masking layer (18) is formed over the substrate (11) and openings are formed in the masking layer (18) to expose the conductive traces (14) and a semiconductor chip attach pad (17). The vent (20) is formed in the masking layer (18). A semiconductor chip (31) is mounted to the semiconductor chip attach pad (17). During a step of encapsulating the semiconductor chip (31) with a mold compound, the vent (20) provides pressure relief.

14 Claims, 2 Drawing Sheets

SEMICONDUCTOR COMPONENT

BACKGROUND OF THE INVENTION

The present invention relates, in general, to articles such as semiconductor devices and, more particularly, to encapsulating the articles.

Semiconductor devices are typically manufactured from a semiconductor wafer. The wafer is then diced up to form chips or dice, which are mounted to a substrate such as a leadframe or a printed circuit board. The leadframe or printed circuit board is then placed in a mold and encapsulated in a molding compound.

The molding compound is typically injected into the mold under a high pressure and an elevated temperature. Because of the high pressures exerted in liquefying and extruding the molding compound, vents are included in the mold to provide a pressure release mechanism. However, the vents tend to accumulate molding compound during each encapsulation step necessitating cleaning of the molds after each use. Further, the vents become worn over time and are subject to damage. Once worn or damaged, the molds need to be replaced. As those skilled in the art are aware, molds are very expensive.

Accordingly, it would be advantageous to have a method and apparatus for encapsulating semiconductor devices that is useful for a large number of device types and that extend the useful life of a mold. It would be of further advantage for the method and apparatus to be cost efficient and easily integrable into existing manufacturing processes.

DETAILED DESCRIPTION OF THE DRAWINGS

Generally, the present invention provides a method and a means for encapsulating a semiconductor chip that eliminates the need for dedicated mold dies as well as the rework of mold dies due to damage or wear. In accordance with the present invention, vents are formed over an article such as a substrate on which a semiconductor chip will be mounted and molded to form a molded structure. In one embodiment of the present invention, the vents are photolithographically formed in a solder mask layer disposed on a printed circuit board. In another embodiment, vents are formed by laser trimming a masking material disposed on the substrate.

Figure 1:
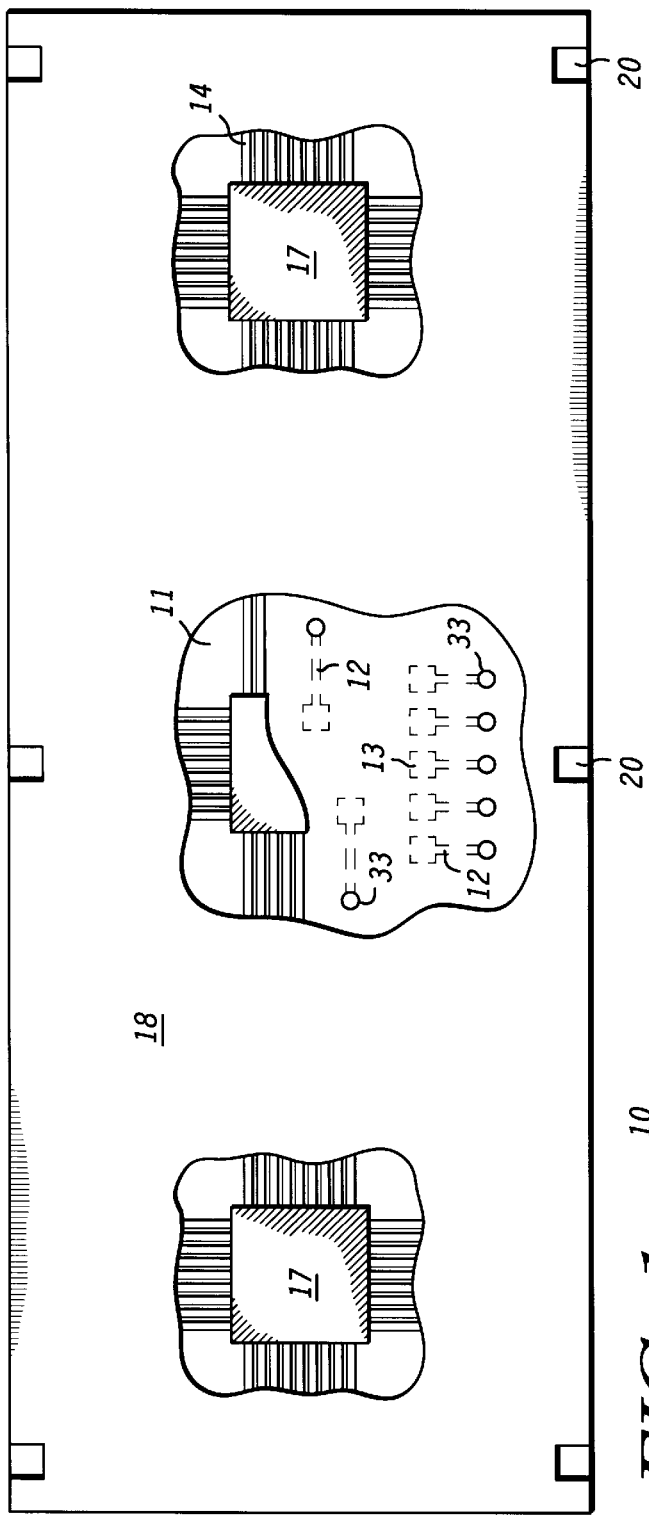
FIG. 1 is a partially cut-away top view of a portion of a semiconductor device during processing in accordance with the present invention.

FIG. 1 illustrates a partially cut-away top view of a portion 10 of a semiconductor device during processing in accordance with an embodiment of the present invention. Portion 10 of the semiconductor device comprises a substrate 11 having conductive traces 12 and bonding pads 13 disposed on the bottom surface and conductive traces 14 and chip or die attach pads 17 disposed on a top surface. Chip attach pads 17 serve as semiconductor chip receiving areas. By way of example, conductive traces 12 and 14, bonding pads 13, and chip attach pads 17 are formed by laminating conductive foil to the top and bottom surfaces of substrate 11. Conductive traces 12 and 14, bonding pads 13, and chip attach pads 17 are defined by patterning the conductive foil using lithographic techniques. Alternatively, conductive traces 12 and 14, bonding pads 13, and chip attach pads 17 may be screen printed or otherwise deposited onto surfaces of substrate 11. Subsequently, conductive traces 12 and 14, bonding pads 13, and chip attach pads 17 are typically plated with gold or a combination of gold and nickel to form a non-oxidizable surface for wirebonding and attaching solder balls 34 (shown in FIG. 3). Although conductive traces 12 and 14, bonding pads 13, and chip attach pads 17 have been described as comprising two conductive layers, it should be understood that the number of conductive layers and the materials of the conductive layers is not a limitation of the present invention. Conductive vias 33 are typically formed in substrate 11 by mechanical or laser drilling or by punching holes through the substrate and subsequently plating the holes with a conductive material such as, for example, copper. Other suitable materials for plating the holes include gold, nickel, a combination of gold and nickel, and the like. Thus, the sidewalls of the holes or vias are conductive, whereas the inner portions are hollow.

The top or major surface is covered with a masking layer such as a layer of solder mask material 18. Preferably, solder mask material 18 has a thickness ranging from approximately 12 micrometers ($\mu$m) to approximately 60 $\mu$m. Suitable solder mask materials include polyimide, high temperature epoxy resins, metal, photoresist, and the like. Likewise, the bottom surface is covered with a layer of solder mask material 19 (shown in FIG. 2). Suitable solder mask materials include polyimide, high temperature epoxy resins, and the like. Vents 20 are formed in the solder mask material to allow venting of the mold die during a subsequent encapsulation stage. Vents 20 may be formed in the either solder mask material 18, solder mask material 19 or both. Vents 20 are formed in the solder mask to allow venting of the mold die during a subsequent encapsulation stage. In accordance with one embodiment, vents 20 are formed using photolithographic techniques. In accordance with another embodiment, vents 20 are formed using laser trimming techniques. In accordance with yet another embodiment, vents 20 are formed using a machining process such as, for example, milling. It should be understood that the method used to form vents 20 is not a limitation of the present invention.

Although vents 20 are shown as being over substrate 11, it should be understood that there may be an intermediate layer between vents 20 and substrate 11. For example, a layer of metal (not shown) may be formed over substrate 11 and vents 20 may be formed over the metal layer. Other suitable materials for the intermediate layer include silicon dioxide, polyimide, ceramics, or the like.

In addition, openings (not shown) are formed in solder mask material 18 to expose chip attach pads 17 and portions of conductive traces 14 and openings or holes (not shown) are formed in solder mask material 19 to expose bonding pads 13. Methods for forming conductive traces, bonding pads, chip attach pads, and layers of solder mask material on a substrate are well known to those skilled in the art.

Figure 2:
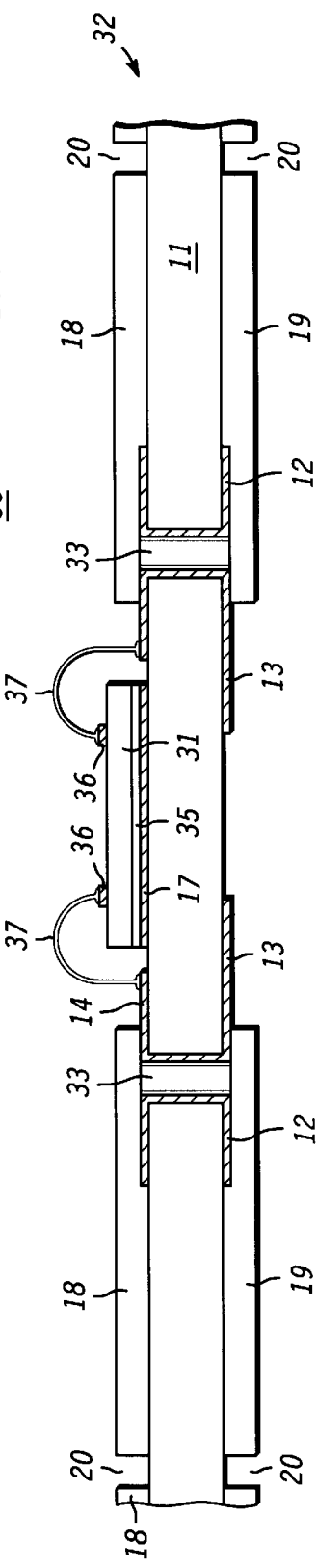
FIG. 2 is a highly enlarged cross-sectional view of a portion of a semiconductor device in accordance with the present invention.

Now referring to FIG. 2, a highly enlarged cross-sectional view of a semiconductor device 30 in accordance with the present invention is shown. Semiconductor device 30 is also referred to as a semiconductor component. By way of example, semiconductor device 30 comprises a semiconductor chip 31 coupled to a Ball Grid Array (BGA) substrate 32. It should be understood that the same reference numerals are used in the figures to denote the same elements. It should be further understood that the present invention is not limited to being used with a BGA substrate. For example, the present invention can be used with a Pin Grid Array (PGA) substrate, an Overmolded Pad Array Carrier (OMPAC) substrate, or the like. BGA substrate 32 includes substrate 11 having conductive traces 12 and bonding pads 13 on a bottom surface and conductive traces 14 and a die attach pad 17 on a top surface. Each conductive trace 14 on the top surface is coupled to a corresponding conductive trace 12 on the bottom surface by conductive vias 33. Although the inner portions of conductive vias 33 are shown as being hollow, it should understood that this is not a limitation of the present invention and that conductive vias 33 may be filled with a conductive material. Semiconductor device 30 further includes solder mask layers 18 and 19. As discussed hereinbefore, vents 20 may be formed in solder mask layer 18, solder mask layer 19, or both.

Semiconductor chip 31 is coupled to chip attach pad 17 via a die attach material 35 such as, for example, a silver filled epoxy. Other suitable die attach materials include rubbers, silicones, polyurethanes, and thermoplastics. Chip bond pads 36 are coupled to corresponding conductive traces 14 via interconnect wires 37. Techniques for coupling semiconductor chips to chip attach pads and wirebonding chip bond pads with conductive traces are well known to those skilled in the art.

Figure 3:
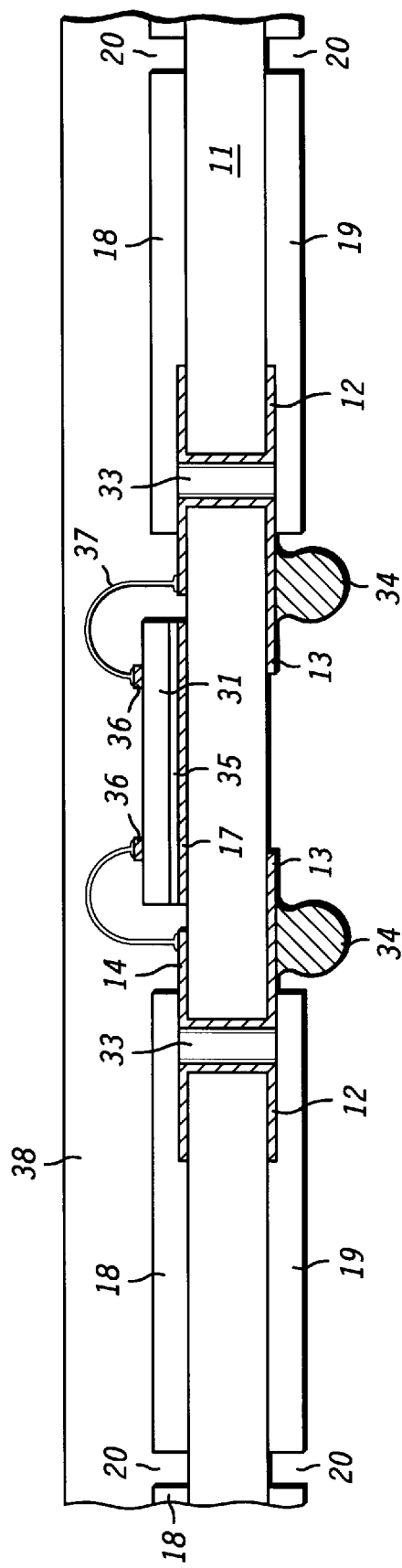
FIG. 3 is a highly enlarged cross-sectional view of the portion of the semiconductor device of FIG. 2 after being molded.

Now referring to FIG. 3, BGA substrate 32 is shown after encapsulation with a mold compound 38 but prior to singulation. In accordance with the present invention, BGA substrate 32 is placed in a mold so that semiconductor die 31 can be covered with an encapsulating material 38. Suitable materials for encapsulating material 38 include a high purity, low stress, mold encapsulant or compound. Preferably, mold compound or encapsulating material 38 is selected to have a coefficient of thermal expansion that matches the coefficient of thermal expansion of semiconductor chip 31. It should be noted that in accordance with the present invention the amount of encapsulating material 38 in contact with semiconductor chip 31 is greater than the amount of encapsulating material 38 in contact with substrate 11. Thus, to lower thermally induced stresses on semiconductor chip 31, it is desirable to match the coefficient of thermal expansion of encapsulating material 38 to that of semiconductor chip 31 rather than to that of substrate 11. An advantage of matching the coefficients of thermal expansion of encapsulating material 38 and semiconductor chip 31 is that it prevents breakage of wires in contact with semiconductor chip 31. It should be noted that encapsulating material 38 protects semiconductor chip 31 from moisture, mechanical stresses, contamination, conductive debris, alpha emissions, etc.

By now it should be appreciated that a method and a means have been provided for forming a semiconductor device. The semiconductor device includes a substrate having vents formed thereon. By including the vents with the substrate, they can be eliminated from the molds. This feature is particularly advantageous because it lowers the maintenance costs associated with molds, i.e., the molds do not have to be cleaned to remove molding compound that may fill the vents. In the present invention, the portions of the package having the vents are merely excised during singulation. In addition, the present invention allows the use of universal molds because the vents are present in the package and not the mold. Thus, a single mold can be used for molding or encapsulating many different types of devices. One reason this is advantageous is that it requires fewer molds, thereby lowering the cost of the molds.

We claim:

1. A semiconductor component, comprising:

a substrate having first and second surfaces, wherein the first surface has a semiconductor chip attach pad formed thereon and the second surface has a bonding pad formed thereon; and a masking layer disposed over the first surface, the masking layer having at least one vent formed therein.

2. The semiconductor component of claim 1, wherein the substrate is a printed circuit board.

3. The semiconductor component of claim 1, wherein the masking layer is selected from the group consisting of a solder mask, a metal, a polyimide, and photoresist.

4. The semiconductor component of claim 1, further including a semiconductor chip mounted to the semiconductor chip attach pad.

5. The semiconductor component of claim 4, further including a molding compound encapsulating the semiconductor chip.

6. The semiconductor component of claim 1, further including at least one solder ball mounted to the second surface.

7. An article which cooperates with a mold and a molding compound to form a molded structure, the article comprising:

a substrate having first and second surfaces; and a vent overlaying the first surface of the substrate, the vent separate from the mold.

8. The article of claim 7, further including a masking layer disposed on the substrate.

9. The article of claim 8, wherein the vent is in the masking layer.

10. The article of claim 8, wherein the substrate is a printed circuit board.

11. The article of claim 10, wherein the masking layer is a solder mask.

12. The article of claim 8, wherein the substrate is a ball grid array substrate and the masking layer is a solder mask.

13. The article of claim 7, wherein the substrate has a semiconductor chip receiving area.

14. The article of claim 13, further including a semiconductor chip coupled to the semiconductor chip receiving area.

* * * * *